US012777718B2

(12) United States Patent
Jia et al.

(10) Patent No.: US 12,777,718 B2
(45) Date of Patent: Oct. 27, 2026

(54) DISPLAY SUBSTRATE, METHOD FOR MANUFACTURING THE SAME, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yihe Jia, Beijing (CN); Xiao Wang, Beijing (CN); Xiangqian Ding, Beijing (CN); Weitao Chen, Beijing (CN); Hui Guo, Beijing (CN); Haipeng Liu, Beijing (CN); Xun Wang, Beijing (CN); Jiantao Liu, Beijing (CN); Jing Liu, Beijing (CN); Yongzhi Song, Beijing (CN); Yan Pang, Beijing (CN)

(73) Assignees: BEIJING BOE DISPLAY TECHNOLOGY CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 914 days.

(21) Appl. No.: 18/016,876

(22) PCT Filed: Jan. 25, 2022

(86) PCT No.: PCT/CN2022/073778

§ 371 (c)(1),
(2) Date: Jan. 19, 2023

(87) PCT Pub. No.: WO2023/141761

PCT Pub. Date: Aug. 3, 2023

(65) Prior Publication Data

US 2024/0153968 A1 May 9, 2024

(51) Int. Cl.
*H10D 86/40* (2025.01)
*H10D 86/01* (2025.01)
*H10D 86/60* (2025.01)

(52) U.S. Cl.
CPC .......... *H10D 86/60* (2025.01); *H10D 86/021* (2025.01); *H10D 86/443* (2025.01)

(58) Field of Classification Search
CPC .... H10D 86/60; H10D 86/021; H10D 86/443; H10D 86/441; H01L 23/528; H01L 21/77; H01L 21/768; G02F 1/1362
See application file for complete search history.

(56) References Cited

U.S. PATENT DOCUMENTS

2014/0240630 A1 8/2014 Jung
2017/0062486 A1 3/2017 Zhang et al.
(Continued)

FOREIGN PATENT DOCUMENTS

CN 100423275 C 10/2008
CN 104007572 A 8/2014
(Continued)

*Primary Examiner* — Sue A Purvis
*Assistant Examiner* — Carnell Hunter, III
(74) *Attorney, Agent, or Firm* — WHDA, LLP

(57) ABSTRACT

A display substrate, a method for manufacturing the same, and a display device are provided. The display substrate includes: a first signal line and a second signal line arranged in the peripheral region of the base substrate; a first insulating layer located on a side of the first signal line away from the base substrate; the first signal line and the second signal line are connected via a connection wiring, the connection wiring is located on a side of the first insulating layer away from the base substrate, a groove is formed on the side of the first insulating layer away from the base substrate, an orthographic projection of the connection wiring on the base substrate overlaps with an orthographic projection of the groove on the base substrate; the connec-
(Continued)

tion wiring includes: a first connection line including a first portion and a second portion.

15 Claims, 8 Drawing Sheets

(56) References Cited

U.S. PATENT DOCUMENTS

| | | | | |
|---|---|---|---|---|
| 2017/0193943 | A1* | 7/2017 | Cao | H03K 17/6871 |
| 2017/0262109 | A1 | 9/2017 | Choi et al. | |
| 2017/0288007 | A1 | 10/2017 | Shin et al. | |
| 2018/0129111 | A1* | 5/2018 | Wu | H10D 86/60 |
| 2020/0365627 | A1* | 11/2020 | Zhang | H10D 86/411 |
| 2021/0233939 | A1 | 7/2021 | Wang et al. | |

FOREIGN PATENT DOCUMENTS

| | | | |
|---|---|---|---|
| CN | 104766869 | A | 7/2015 |
| CN | 205920296 | U | 2/2017 |
| CN | 107180848 | A | 9/2017 |
| CN | 107275366 | A | 10/2017 |
| CN | 108493155 | A | 9/2018 |
| CN | 109884830 | A | 6/2019 |
| CN | 112310044 | A | 2/2021 |
| CN | 113161401 | A | 7/2021 |
| WO | 2013076941 | A1 | 5/2013 |

* cited by examiner

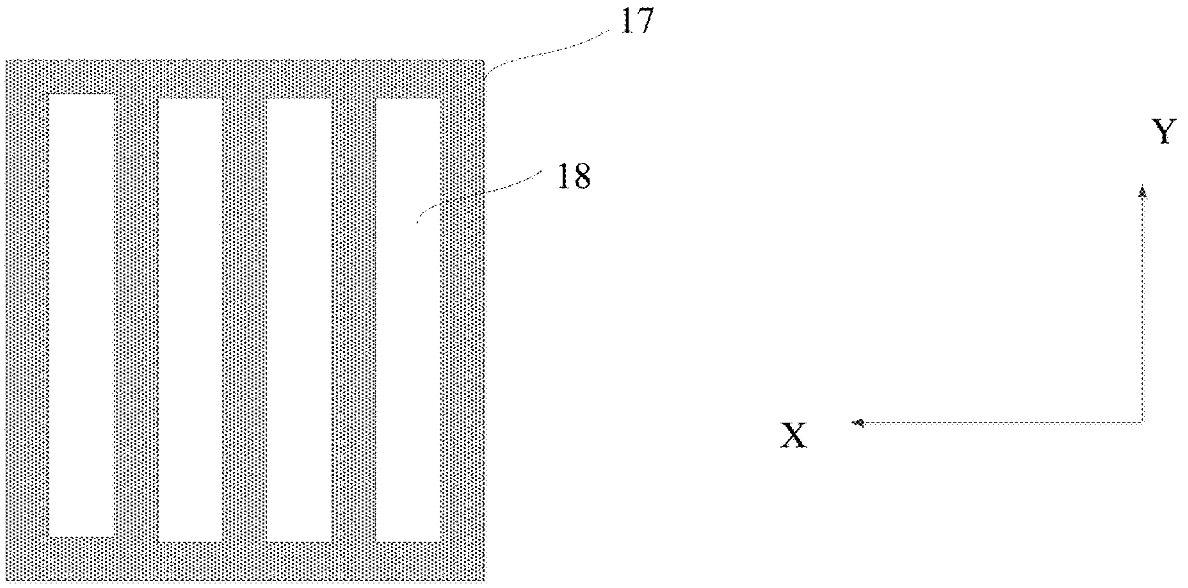
Fig. 4
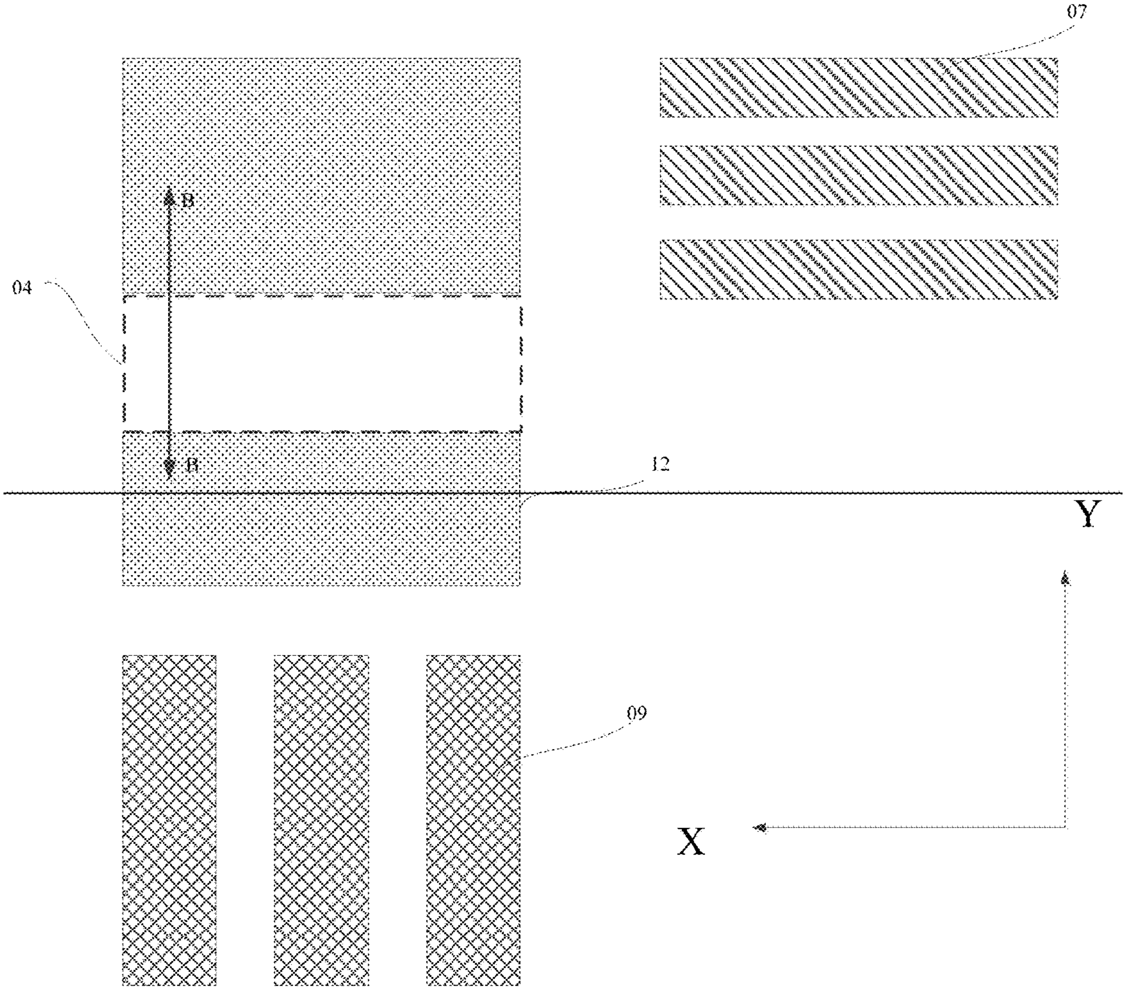

DISPLAY SUBSTRATE, METHOD FOR MANUFACTURING THE SAME, AND DISPLAY DEVICE

CROSS-REFERENCE TO RELATED APPLICATIONS

This application is the U.S. national phase of PCT Application No. PCT/CN2022/073778 filed on Jan. 25, 2022, the disclosure of which is incorporated in its entirety by reference herein.

TECHNICAL FIELD

The present disclosure relates to the technical field of display, and more particularly to a display substrate, a method for manufacturing the same and a display device.

BACKGROUND

In a desktop display product with touch function, due to a touch-control module added onto the display module, a parasitic capacitance is generated between touch-control wirings and signal lines of the display module, which may aggravate an adverse phenomenon like stains. Therefore, an organic film layer needs to be introduced between the display module and the touch-control module, so as to reduce the parasitic capacitance between the touch-control wirings and the signal lines.

SUMMARY

The technical problem to be solved by the present disclosure is to provide a display substrate, a method for manufacturing the same, and a display device, which can prevent abnormal display of pictures.

In order to solve the above technical problem, the embodiments of the present disclosure provide the following technical solutions.

In an aspect, a display substrate is provided, including a base substrate including a display region and a peripheral region surrounding the display region, wherein the display substrate includes:

a first signal line and a second signal line arranged in the peripheral region of the base substrate;

a first insulating layer located on a side of the first signal line away from the base substrate;

the first signal line and the second signal line are connected via a connection wiring, the connection wiring is located on a side of the first insulating layer away from the base substrate, a groove is formed on the side of the first insulating layer away from the base substrate, the depth of the groove is greater than a preset threshold, and an orthographic projection of the connection wiring on the base substrate overlaps with an orthographic projection of the groove on the base substrate;

the connection wiring includes:

a first connection line including a first portion and a second portion, wherein the first portion covers the bottom and side walls of the groove, and the second portion covers an area of the first insulating layer outside the groove.

In some embodiments, the display substrate further includes:

a second insulating layer on a side of the first connection line away from the base substrate;

the connection wiring further includes:

a second connection line located on a side of the second insulating layer away from the base substrate, wherein the second connection line is connected to the first connection line via a via hole penetrating the second insulating layer, the second connection line is provided for connecting the first connection line to the first signal line and the second signal line, an orthographic projection of the second connection line on the base substrate does not overlap with the orthographic projection of the groove on the base substrate, and the depth of the via hole is less than the depth of the groove.

In some embodiments, a first orthographic projection of the first portion on the base substrate is located within the orthographic projection of the groove on the base substrate, a second orthographic projection of the second portion on the base substrate is located outside the orthographic projection of the groove on the base substrate, and a ratio of area of the first orthographic projection to the second orthographic projection ranges from 6:1 to 1:1.

In some embodiments, an extending direction of the first connection line is parallel with an extending direction of the first signal line.

In some embodiments, a distance between adjacent first connection lines is 10-15 um.

In some embodiments, the second connection line includes a hollowed-out region, and an extending direction of the hollowed-out region is parallel to an extending direction of the second connection line.

In some embodiments, the second connection line includes a third portion and a fourth portion, a third orthographic projection of the third portion on the base substrate is located within the orthographic projection of the first connection line on the base substrate, a fourth orthographic projection of the fourth portion on the base substrate is located outside the orthographic projection of the first connection line on the base substrate, and the ratio of area of the third orthographic projection to the fourth orthographic projection ranges from 1:20 to 1:25.

In some embodiments, the second connection line includes a fifth portion and a sixth portion, a fifth orthographic projection of the fifth portion on the base substrate is located within an orthographic projection of the via hole on the base substrate, a sixth orthographic projection of the sixth portion on the base substrate is located outside the orthographic projection of the via hole on the base substrate, and a ratio of area of the fifth orthographic projection to the sixth orthographic projection ranges from 1:20 to 1:25.

In some embodiments, the second connection line includes a seventh portion and an eighth portion, the seventh portion connects the first connection line to the first signal line, the eighth portion connects the first connection line to the second signal line, the seventh portion extends in a direction parallel to the first signal line, the eighth portion is L-shaped, and the eighth portion includes a first sub-portion parallel to the first signal line and a second sub-portion parallel to the second signal line.

In some embodiments, the via hole is a rectangular via hole with a side length of 6-8 um.

In some embodiments, the preset threshold is 2 um.

In some embodiments, the connection wiring is made of a transparent conductive material.

In some embodiments, the second connection line is in the same layer and made of the same material as a pixel electrode of the display substrate; and/or, the first connection line is in the same layer and made of the same material as a common electrode of the display substrate.

In some embodiments, the first signal line is a clock signal line of a gate driving unit;

the second signal line is a signal line of a sector region.

An embodiment of the present disclosure further provides a display device including the display substrate described above.

An embodiment of the present disclosure further provides a method for manufacturing a display substrate, the display substrate including a base substrate including a display region and a peripheral region surrounding the display region, the method including:

forming a first signal line and a second signal line in the peripheral region of the base substrate;

forming a first insulating layer on a side of the first signal line away from the base substrate;

forming a connection wiring connecting the first signal line and the second signal line, wherein the connection wiring is located on a side of the first insulating layer away from the base substrate, a groove is formed in the side of the first insulating layer away from the base substrate, the depth of the groove is greater than a preset threshold, and an orthographic projection of the connection wiring on the base substrate overlaps with an orthographic projection of the groove on the base substrate;

the forming the connection wiring includes:

forming a first conductive layer on the side of the first insulating layer away from the base substrate, forming a photoresist pattern on the first conductive layer, overexposing the photoresist pattern, and etching the first conductive layer using the photoresist pattern as a mask to form a first connection line, wherein the first connection line includes a first portion and a second portion, wherein the first portion covers the bottom and a side wall of the groove, and the second portion covers an area of the first insulating layer outside the groove.

In some embodiments, the method further includes:

forming a second insulating layer on a side of the first connection line away from the base substrate, patterning the second insulating layer to form a via hole exposing the first connection line, wherein the depth of the via hole is less than the depth of the groove;

the forming the connection wiring further includes:

forming a second connection line located on a side of the second insulating layer away from the base substrate, wherein the second connection line is connected to the first connection line via a via hole penetrating the second insulating layer, the second connection line is used for connecting the first connection line to the first signal line and the second signal line, an orthographic projection of the second connection line on the base substrate does not overlap with the orthographic projection of the groove on the base substrate, and the depth of the via hole is less than the depth of the groove.

The embodiments of present disclosure has the following beneficial effects.

In the above-mentioned solution, the first signal line and the second signal line are connected via the first connection line, and the first connection line does not have a hollowed-out region. When the first connection line is formed, the photoresist on the conductive film layer forming the first connection line can be overexposed to form the first connection line, so as to prevent the residual conductive film layer in the groove, and further to prevent the residual conductive film layer from shorting different signal lines together, thereby preventing picture abnormality and ensuring the yield of the display product.

BRIEF DESCRIPTION OF THE DRAWINGS

FIG. 4 shows a schematic plan view of a second transparent conductive layer;

REFERENCE NUMERALS

Figure 1:
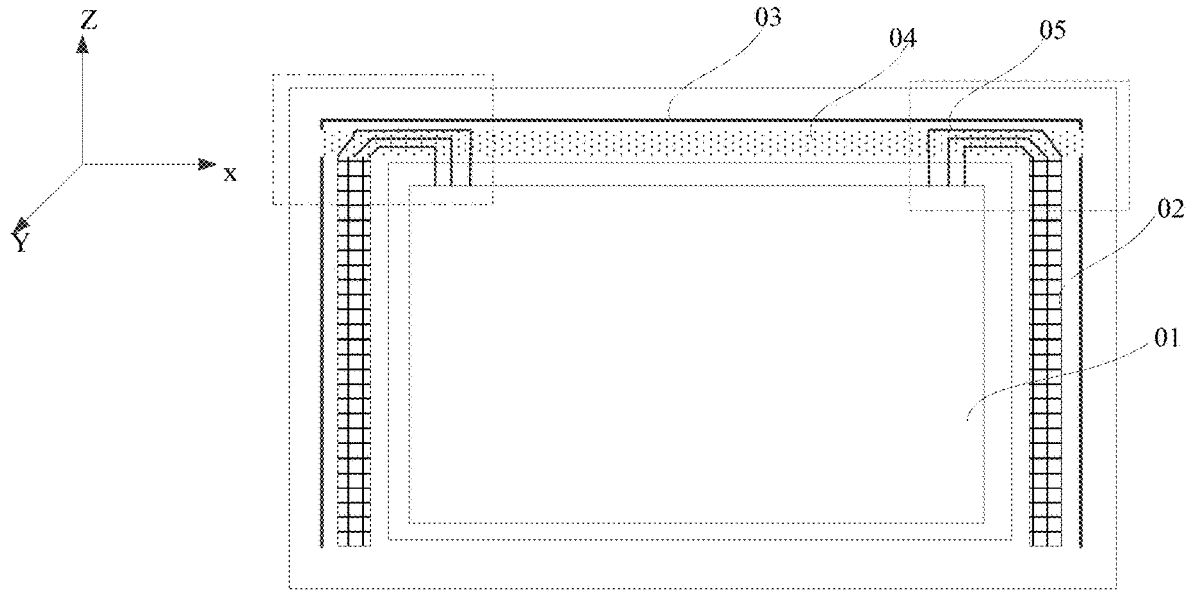
FIG. 1 shows a planar schematic diagram of a display substrate.

01 Display region
02 GOA region
03 Power supply voltage line
04 Groove
05 Second transparent conductive layer
07 Clock signal line, 07A First signal line
08, 10 Via hole
09 Signal line, 09A Second signal line
11 Residual second transparent conductive layer
12 Organic film layer; 12A First insulating layer
13 Second insulating layer
14 Gate insulating layer
15 First connection line
151 First portion
152 Second portion
161-164 Via holes
17 Second connection line
171 Seventh portion
172 Eighth portion
173 Third portion
174 Fourth portion
175 Fifth portion
176 Sixth portion
18 Hollowed-out region

DETAILED DESCRIPTION

In order that the technical problems, technical solutions, and advantages to be solved by the embodiments of the present disclosure will become more apparent, a detailed description will be given below with reference to the accompanying drawings and specific embodiments.

Figure 2:
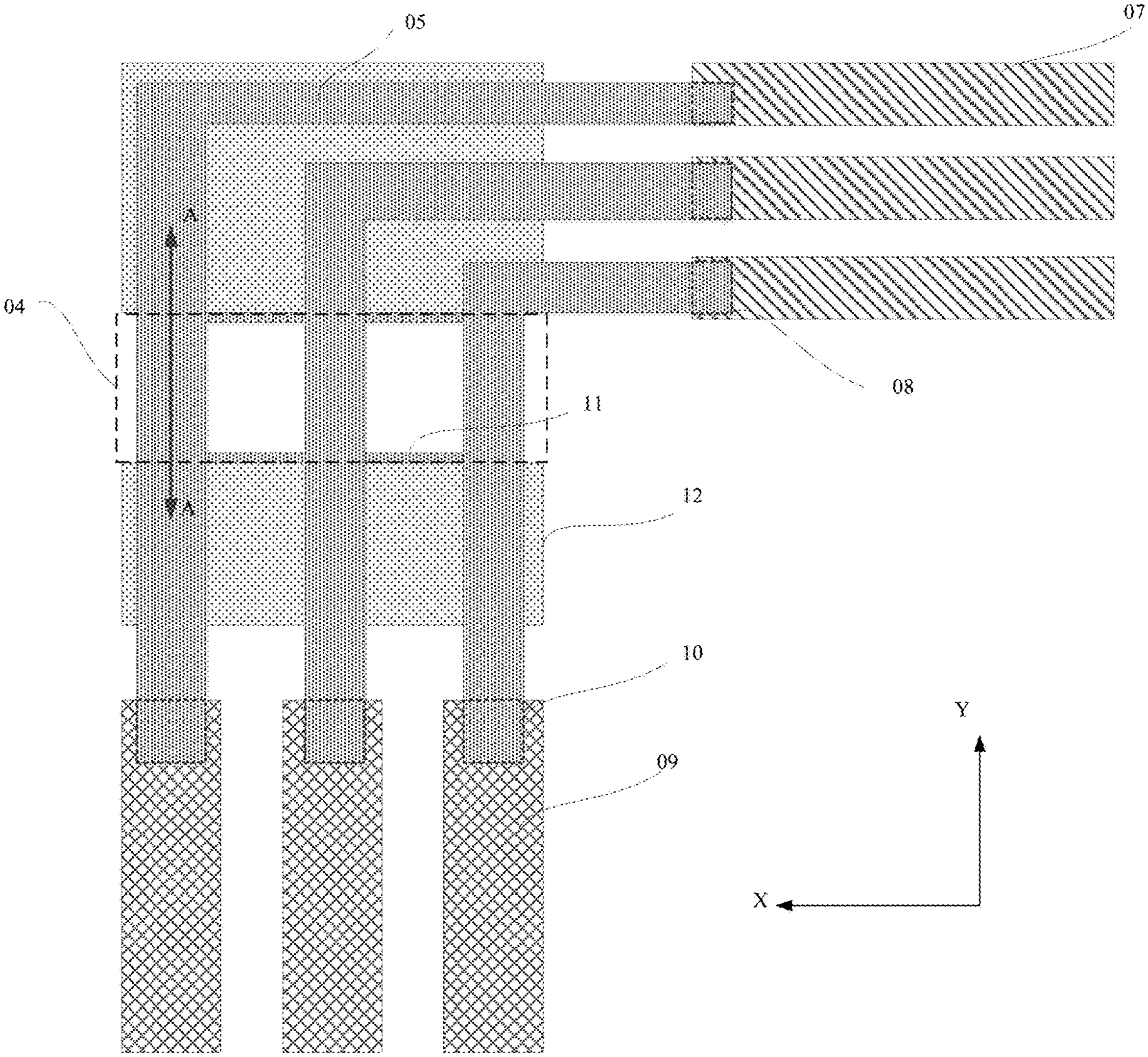
FIGS. 2 and 3 shows a schematic diagram of a display substrate in the related art.
Figure 3:
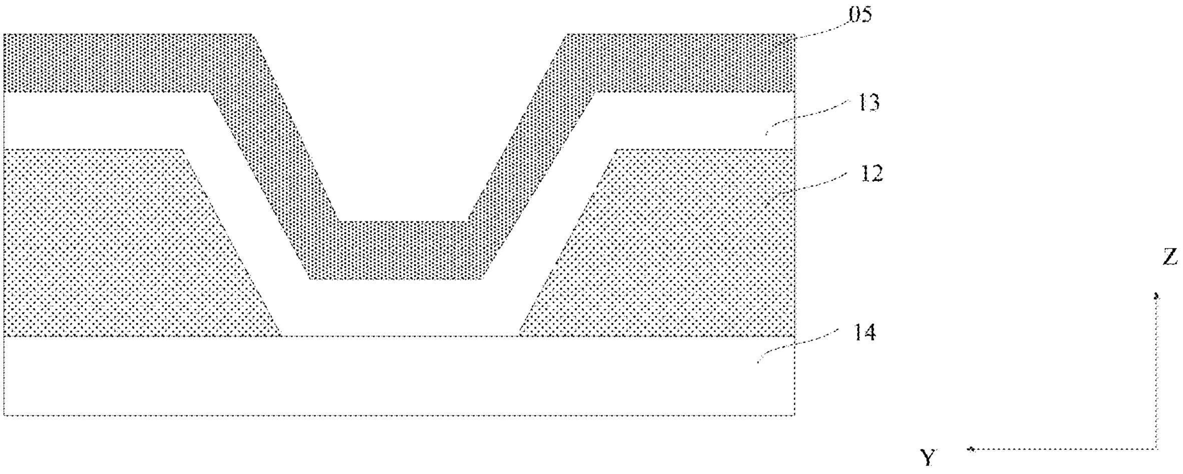

When an organic film layer is introduced between a display module and a touch control module, a clock signal line at the periphery of a gate driving circuit (GOA) area 02 may be shorted. Since the organic film layer has water absorption, in order to prevent external water vapor from invading into the interior of the display product, as shown in FIG. 1, the organic film layer will be grooved in the encapsulation area to form a groove 04, and the encapsulation glue can be coated in the groove 04 to act as a water vapor barrier, wherein an X direction is parallel to one side edge of the display substrate, a Y direction is parallel to the other side edge of the display substrate, a Z direction is perpendicular to the display substrate, the X direction is perpendicular to the Y direction, the X direction is perpendicular to the Z direction, and the Y direction is perpendicular to the Z direction. In the related art, as shown in FIGS. 2 and 3, a clock signal line 07 at the periphery of a GOA area 02 is connected to a signal line 09 in a display region 01 through a wiring made of a second transparent conductive layer 05, wherein FIG. 3 is a schematic cross-sectional view in the direction AA of FIG. 2. For fabricating the wiring, the second transparent conductive layer 05 is formed on an organic film layer 12 on which a groove 04 is formed, a photoresist is coated on the second transparent conductive layer 05, a photoresist pattern is formed after the photoresist is exposed and developed, and the wiring is formed after the second transparent conductive layer 05 is patterned by the photoresist pattern as a mask. The wiring is connected to the clock signal line 07 via a via hole 08 and connected to the signal line 09 via the via hole 10. Since the thickness of the organic film layer 12 is relatively large and the groove 04 is relatively deep, the photoresist at the bottom of the groove 04 cannot be fully exposed, as shown in FIG. 2, resulting in a residual second transparent conductive layer 11 at the bottom of the groove 04, and the residual second transparent conductive layer 11 may cause different signal lines shorted together, resulting in abnormal display of pictures.

The embodiments of the present disclosure provide a display substrate, a method for manufacturing the same, and a display device, which can prevent abnormal display of pictures.

An embodiment of the present disclosure provides a display substrate, including a base substrate including a display region and a peripheral region surrounding the display region, wherein the display substrate includes:

- a first signal line and a second signal line in the peripheral region of the base substrate;
- a first insulating layer on a side of the first signal line away from the base substrate;
- the first signal line and the second signal line are connected via a connection wiring, the connection wiring is located on a side of the first insulating layer away from the base substrate, a groove is formed in the side of the first insulating layer away from the base substrate, the depth of the groove is greater than a preset threshold, and an orthographic projection of the connection wiring on the base substrate overlaps with an orthographic projection of the groove on the base substrate;
- the connection wiring includes:
- a first connection line including a first portion and a second portion, wherein the first portion covers the bottom and a side wall of the groove, and the second portion covers an area of the first insulating layer outside the groove.

In this embodiment, the first signal line and the second signal line are connected via the first connection line, and the first connection line does not have a hollowed-out region. When the first connection line is formed, the photoresist on the conductive film layer forming the first connection line can be overexposed to form the first connection line, so as to prevent residual conductive film layer in the groove, and further to prevent the residual conductive film layer from shorting different signal lines together, thereby preventing abnormal display of pictures and ensuring the yield of the display product.

The first insulating layer 12A may be an organic film layer 12 located between the display module and the touch control module. In order to reduce the parasitic capacitance between the touch control wiring and the signal line, the thickness of the organic film layer is relatively large, for example greater than 2.5 um, and the depth of the groove is relatively large, generally greater than 2 um. When making a first connection line, the first conductive layer is formed on the side of the first insulating layer away from the base substrate, and the photoresist pattern is formed on the first conductive layer. In order to prevent the residual first conductive layer at the bottom of the groove, the photoresist pattern for forming the first connection line on the first conductive layer is overexposed, so as to ensure that the photoresist at the bottom of the groove can be fully exposed. Then, the first conductive layer is etched to form the first connection line, so as to prevent the residual first conductive layer at the bottom of the groove.

In some embodiments, The display substrate further includes:

- a second insulating layer on a side of the first connection line away from the base substrate;
- the connection wiring further includes:
- a second connection line located on a side of the second insulating layer away from the base substrate, wherein the second connection line is connected to the first connection line via a via hole penetrating the second insulating layer, the second connection line is used for connecting the first connection line to the first signal line and the second signal line, an orthographic projection of the second connection line on the base substrate does not overlap with the orthographic projection of the groove on the base substrate, and the depth of the via hole is less than the depth of the groove.

In this embodiment, the first signal line, the second signal line and the first connection line are located in different film layers, and the first signal line, the second signal line and the first connection line are connected via the second connection line, wherein the second insulating layer may be an inorganic insulating layer, the thickness of the second insulating layer is relatively small and less than the thickness of the first insulating layer, the depth of the via hole for connecting the first connection line and the second connection line is less than the depth of the groove, and the second conductive layer forming the second connection line may not remain in the via hole.

To prevent affecting the transmission of the display substrate, the connection wiring may be made of a transparent conductive material, such as ITO, IZO, etc. In order to prevent increasing the number of patterning processes of the display substrate, the first connection line and the second connection line may be arranged in the same layer and made of the same material as the original film layer of the display substrate. For example, the second connection line is in the same layer and made of the same material as the pixel electrode of the display substrate, and thus the second connection line and the pixel electrode of the display substrate may be formed by one patterning process; the first connection line is in the same layer and made of the same material as the common electrode of the display substrate, so that the first connection line and the common electrode of the display substrate may be formed by one patterning process.

In this embodiment, the first signal line 07A and the second signal line 09A may be any signal lines to be connected on the display substrate, and in some embodiments, the first signal line 07A may be a clock signal line of a gate driving unit; the second signal line 09A may be a signal line of a sector region.

Figure 11:
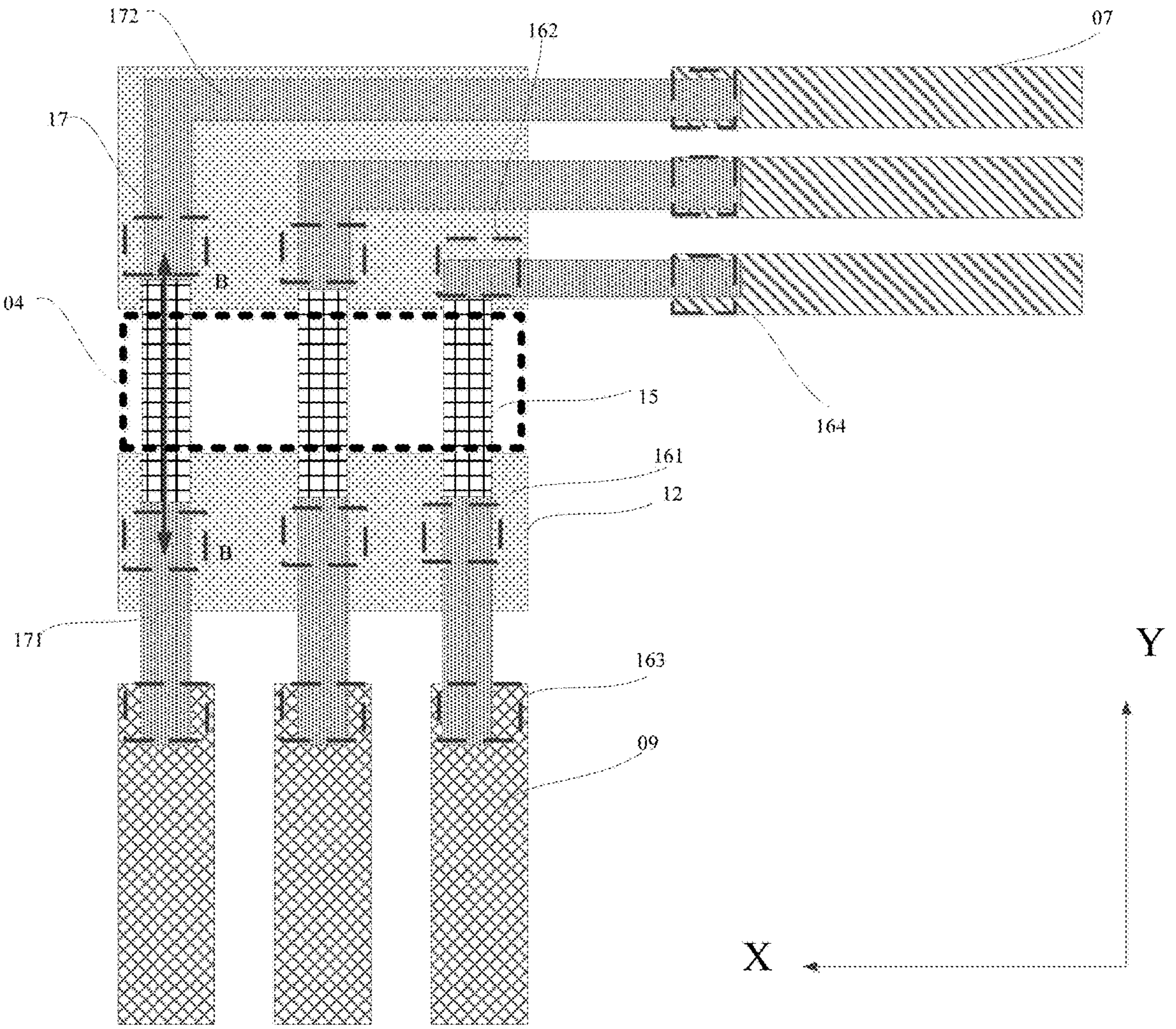
Figure 12:
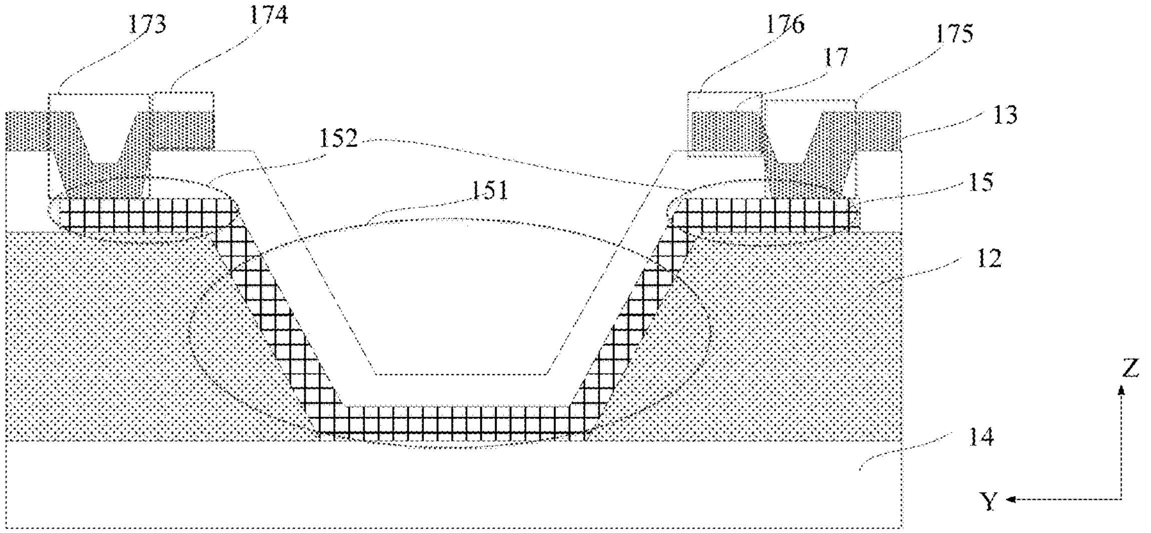

In a particular example, in the position shown by a dotted line box in FIG. 1, as shown in FIGS. 11 and 12 (FIG. 12 is a schematic cross-sectional view in the Z direction in the BB direction of FIG. 11, namely, a cross-section in the YZ plane), the clock signal line 07 is connected to the signal line 09 via the connection wiring, and the connection wiring includes a first connection line 15 and a second connection line 17. The first connection line 15 is connected to the second connection line 17 via a via hole 161 and a via hole 162, and an extending direction of the first connection line 15 may be parallel to an extending direction of the signal line 09. The second connection line 17 includes a seventh portion 171 and an eighth portion 172, the seventh portion 171 is connected to the first connection line 15 and the signal line 09, and the seventh portion 171 is connected to the signal line 09 via a via hole 163 and is connected to the first connection line 15 via a via hole 161. The eighth portion 172 is connected to the first connection line 15 and the clock signal line 07, and the eighth portion 172 is connected to the first connection line 15 via the via hole 162, and is connected to the signal line 07 via a via hole 164. The seventh portion 171 extends in a direction parallel to the signal line 09, the eighth portion 172 is L-shaped, and the eighth portion 172 includes a first sub-portion parallel to the clock signal line 07 and a second sub-portion parallel to the signal line 09; In some embodiments, the eighth portion 172 may be straight-line shaped, and extend parallel to the clock signal line 07.

In this embodiment, the peripheral region of the display substrate is provided with a plurality of clock signal lines 07 arranged in parallel and spaced apart from each other, the widths of adjacent clock signal lines 07 may be the same or different from each other, and the spacing between adjacent clock signal lines 07 may be the same or different.

The via holes (including the via holes 161, 162, 163 and 164) may be an elliptical via hole, a circular via hole or a rectangular via hole. When the via hole is an elliptical via hole, the cross section of the via hole in the direction parallel to the base substrate (the cross section on the XY plane) is elliptical. When the via hole is a circular via hole, the cross section of the via hole in the direction parallel to the base substrate (the cross section on the XY plane) is circular. When the via hole is a rectangular via hole, the cross section of the via hole in the direction parallel to the base substrate (the cross section on the XY plane) is rectangular. In some embodiments, the via hole may be a rectangular via hole, and the side length of the rectangle may be 6-8 um.

As shown in FIG. 12, the cross section of the groove 04 in the direction perpendicular to the base substrate (the cross section in the YZ plane) may be an inverted trapezoid, the length of the upper side of the inverted trapezoid may be 63 um, the length of the lower side may be 60 um, and the depth of the groove may be 2.5 um. In this embodiment, the first connection line 15 may be formed by the first transparent conductive layer of the display substrate, and the first connection line 15 covers the side wall and the bottom of the groove and is beyond the range of the groove.

In some exemplary embodiments, as shown in FIG. 12, the first connection line 15 includes a first portion 151 and a second portion 152, wherein a first orthographic projection of the first portion 151 on the base substrate is located within the orthographic projection of the groove on the base substrate, a second orthographic projection of the second portion 152 on the base substrate is located outside the orthographic projection of the groove on the base substrate, and a ration of area of the first orthographic projection to the second forward projection can be 6:1 to 1:1.

A second insulating layer 13 is formed on a side of the first connection line 15 away from the base substrate, and the second insulating layer 13 may be a passivation layer, and the thickness may be less than 1 um; a second connection line 17 is formed on a side of the second insulating layer 13 away from the base substrate, and the second connection line 17 may be made by the second transparent conductive layer of the display substrate. As shown in FIG. 4, the second connection line 17 formed by the second transparent conductive layer includes a slit-shaped hollowed-out region 18, and an extending direction of the hollowed-out region 18 is parallel to an extending direction of the second connection line 17.

If the second connection line 17 is directly formed by the second transparent conductive layer to connect the clock signal line 07 and the signal line 09, in order to prevent the residual second transparent conductive layer in the groove, when the second connection line is formed, the photoresist for forming the second connection line on the second transparent conductive layer needs to be overexposed to form the second connection line. However, as shown in FIG. 4, the second connection line 17 formed by the second transparent conductive layer 05 includes a slit-shaped hollowed-out region 18, and the over-exposure may cause the second connection line 17 to be too thin to cause an open circuit. However, the first connection line 15 is a complete conductive pattern, which does not include a hollowed-out region, so that when forming the first connection line, the photoresist for forming the first connection line on the first transparent conductive layer may be exposed to form the first connection line without breaking the first connection line.

In order to prevent crosstalk between adjacent first connection lines, the distance between adjacent first connection lines is 10-15 um.

In this embodiment, as shown in FIG. 11, the width of the first connection line 15 may be equal to the width of the second connection line 17, or slightly larger than the width of the second connection line 17, or slightly smaller than the width of the second connection line 17. The width of the second connection line 17 may be equal to the width of the clock signal line 07, or slightly larger than the width of the clock signal line 07, or slightly smaller than the width of the clock signal line 07. The width of the second connection line 17 may be equal to the width of the signal line 09, or slightly larger than the width of the signal line 09, or slightly smaller than the width of the signal line 09.

In some exemplary embodiments, as shown in FIG. 12, the second connection line 17 includes a third portion 173 and a fourth portion 174, wherein a third orthographic projection of the third portion 173 on the base substrate is located within the orthographic projection of the first connection line 15 on the base substrate, a fourth orthographic projection of the fourth portion 174 on the base substrate is located outside the orthographic projection of the first connection line 15 on the base substrate, and a ratio of area of the third orthographic projection to the fourth orthographic projection is 1:20 to 1:25.

In some exemplary embodiments, as shown in FIG. 12, the second connection line 17 includes a fifth portion 175 and a sixth portion 176, wherein a fifth orthographic projection of the fifth portion 175 on the base substrate is located within the orthographic projection of the via holes 161 and 162 on the base substrate, a sixth orthographic projection of the sixth portion 176 on the base substrate is located outside the orthographic projection of the via holes 161 and 162 on the base substrate, and a ratio of area of the fifth orthographic projection to the sixth orthographic projection is 1:20 to 1:25.

An embodiment of the present disclosure further provides a display device including the display substrate described above.

The display device includes, but is not limited to: a radio frequency unit, a network module, an audio output unit, an input unit, a sensor, a display unit, a user input unit, an interface unit, a memory, a processor, a power supply, etc. It will be appreciated by those skilled in the art that the configuration of the display device described above is not intended to be limiting and that the display device may include more or fewer of the components described above, or some combinations of the components, or different arrangements of the components. In embodiments of the present disclosure, the display device includes, but is not limited to, a display, a cell phone, a tablet, a television, a wearable electronic device, a navigation display device, etc.

The display device may be: any product or component with a display function, such as a television, a display, a digital photo frame, a mobile phone, a tablet computer, and among others, the display device further includes a flexible circuit board, a printed circuit board and a back panel.

An embodiment of the present disclosure further provides a method for manufacturing a display substrate, including the following steps:

the display substrate including a base substrate including a display region and a peripheral region surrounding the display region, the method including:

forming a first signal line and a second signal line in the peripheral region of the base substrate;

forming a first insulating layer on a side of the first signal line away from the base substrate;

forming a connection wiring connecting the first signal line and the second signal line, wherein the connection wiring is located on a side of the first insulating layer away from the base substrate, a groove is formed in the side of the first insulating layer away from the base substrate, the depth of the groove is greater than a preset threshold, and an orthographic projection of the connection wiring on the base substrate overlaps with an orthographic projection of the groove on the base substrate;

the forming the connection wiring includes:

forming a first conductive layer on the side of the first insulating layer away from the base substrate, forming a photoresist pattern on the first conductive layer, overexposing the photoresist pattern, and etching the first conductive layer using the photoresist pattern as a mask to form a first connection line, wherein the first connection line includes a first portion and a second portion, wherein the first portion covers the bottom and a side wall of the groove, and the second portion covers an area of the first insulating layer outside the groove.

In this embodiment, the first signal line and the second signal line are connected via the first connection line, and the first connection line does not have a hollowed-out region. When the first connection line is formed, the photoresist on the conductive film layer forming the first connection line can be overexposed to form the first connection line, so as to prevent the residual conductive film layer in the groove, and further to prevent the residual conductive film layer from shorting different signal lines together, thereby preventing abnormal display of pictures and ensuring the yield of the display product.

The first insulating layer may be an organic film layer located between the display module and the touch control module. In order to reduce the parasitic capacitance between the touch control wirings and the signal lines, the thickness of the organic film layer is generally relatively large, for example greater than 2.5 um, and the depth of the groove is relatively large, generally greater than 2 um. When making a first connection line, the first conductive layer is formed on the side of the first insulating layer away from the base substrate, and the photoresist pattern is formed on the first conductive layer. In order to prevent the residual first conductive layer at the bottom of the groove, the photoresist pattern for forming the first connection line on the first conductive layer is overexposed, so as to ensure that the photoresist at the bottom of the groove can be fully exposed. Then, the first conductive layer is etched to form the first connection line, so as to prevent the residual first conductive layer at the bottom of the groove.

In some embodiments, the method further includes:

forming a second insulating layer on a side of the first connection line away from the base substrate, patterning the second insulating layer to form a via hole exposing the first connection line, wherein the depth of the via hole is less than the depth of the groove;

the forming the connection wiring further includes:

forming a second connection line located on a side of the second insulating layer away from the base substrate, wherein the second connection line is connected to the first connection line via a via hole penetrating the second insulating layer, the second connection line is used for connecting the first connection line to the first signal line and the second signal line, an orthographic projection of the second connection line on the base substrate does not overlap with the orthographic projection of the groove on the base substrate, and the depth of the via hole is less than the depth of the groove.

In this embodiment, the first signal line, the second signal line and the first connection line are located in different film layers, and the first signal line, the second signal line and the first connection line are connected via the second connection line, wherein the second insulating layer may be an inorganic insulating layer, the thickness of the second insulating layer is relatively small and less than the thickness of the first insulating layer, the depth of the via hole for connecting the first connection line and the second connection line is less than the depth of the groove, and the second conductive layer forming the second connection line may not remain in the via hole.

To prevent affecting the transmission of the display substrate, the connection wiring may be made of a transparent conductive material, such as ITO, IZO, etc. In order to prevent increasing the number of patterning processes of the display substrate, the first connection line and the second connection line may be arranged in the same layer and made of the same material as the original film layer of the display substrate. For example, the second connection line is in the same layer and made of the same material as the pixel electrode of the display substrate, and thus the second connection line and the pixel electrode of the display substrate may be formed by one patterning process; the first connection line is in the same layer and made of the same material as the common electrode of the display substrate, so that the first connection line and the common electrode of the display substrate may be formed by one patterning process.

In this embodiment, the first signal line and the second signal line may be any signal lines to be connected on the display substrate, and in some embodiments, the first signal line may be a clock signal line of a gate driving unit; the second signal line may be a signal line of a sector region.

Figure 5:
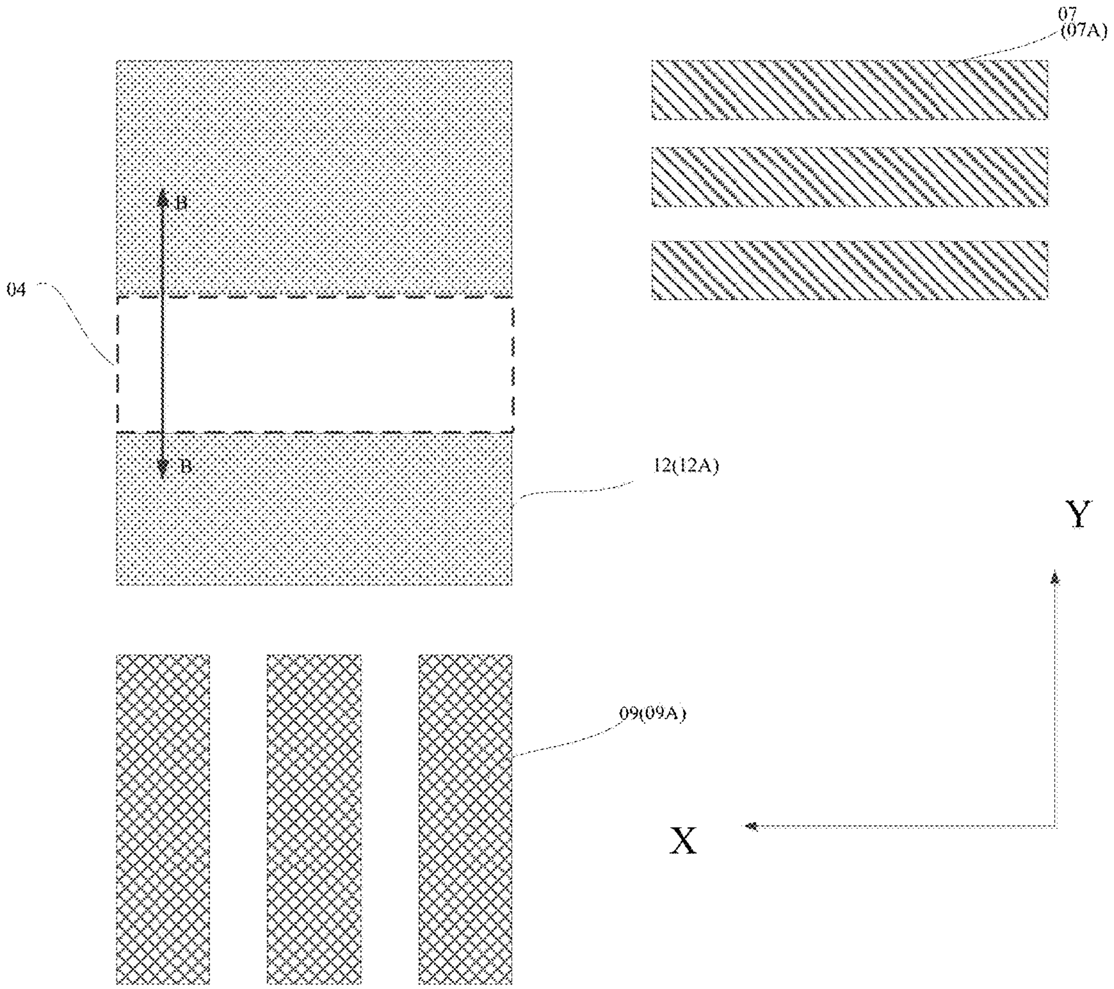
FIGS. 5 to 13 show schematic cross-sectional views of a display substrate in accordance with an embodiment of the present disclosure.
Figure 6:
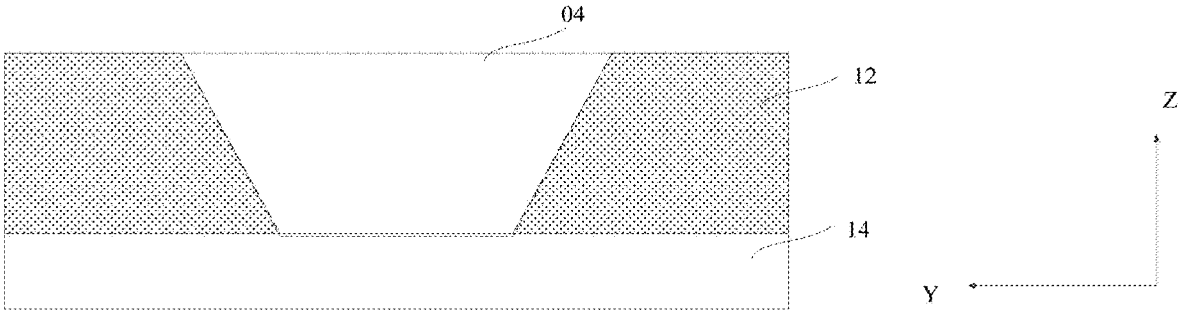
Figure 7:
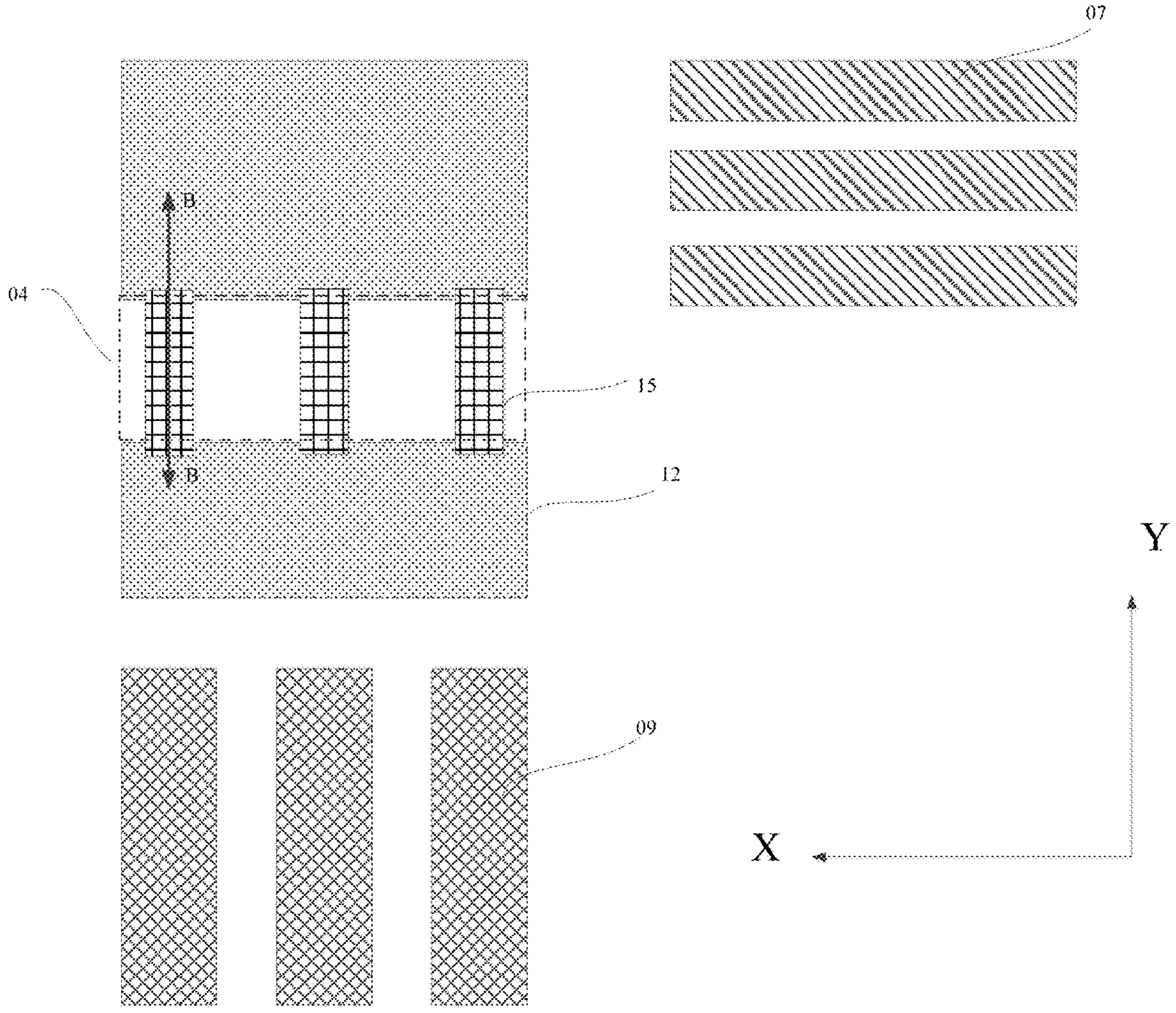
Figure 8:
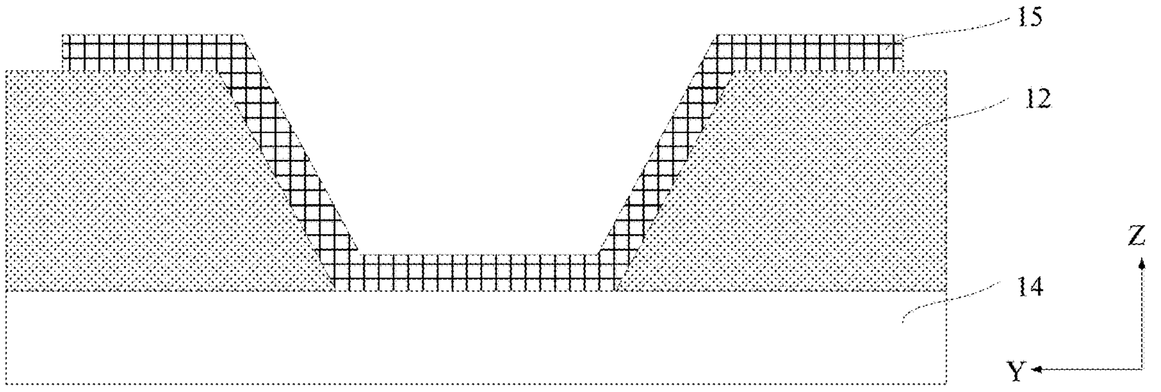

In a particular example, as shown in FIGS. 5 to 12, in this embodiment, the manufacturing method of the present embodiment further includes the following steps:

Step 1, as shown in FIG. 5, forming an organic film layer 12 on a display substrate on which the clock signal line 07 and the signal line 09 are formed, and grooving the organic film layer 12 to form a groove 04, and FIG. 6 is a schematic cross-sectional view in the BB direction of FIG. 5, wherein the organic film layer 12 is located on a gate insulating layer 14; and Step 2, as shown in FIGS. 7 and 8, forming a first connection line 15.

Specifically, a first transparent conductive layer may be formed on the display substrate after Step 1 is completed, wherein the first transparent conductive layer may be made of ITO, IZO or other transparent metal oxides. Then, a layer of photoresist is coated on the first transparent conductive layer, and a mask plate is used to expose the photoresist so that the photoresist forms a photoresist unreserved region and a photoresist reserved region, wherein the photoresist reserved region corresponds to a region where the first connection line 15 is located, and the photoresist unreserved region corresponds to a region outside the above-mentioned pattern. Developing treatment is performed, and the photoresist in the photoresist unreserved region is completely removed, while the photoresist thickness in the photoresist reserved region remains unchanged. The first transparent conductive layer is etched with the photoresist as a mask to form a first connection line 15. When the photoresist is exposed, the exposure amount is increased, and the first transparent conductive layer is prevented from being remained at the bottom of the groove by overexposure.

Figure 13:
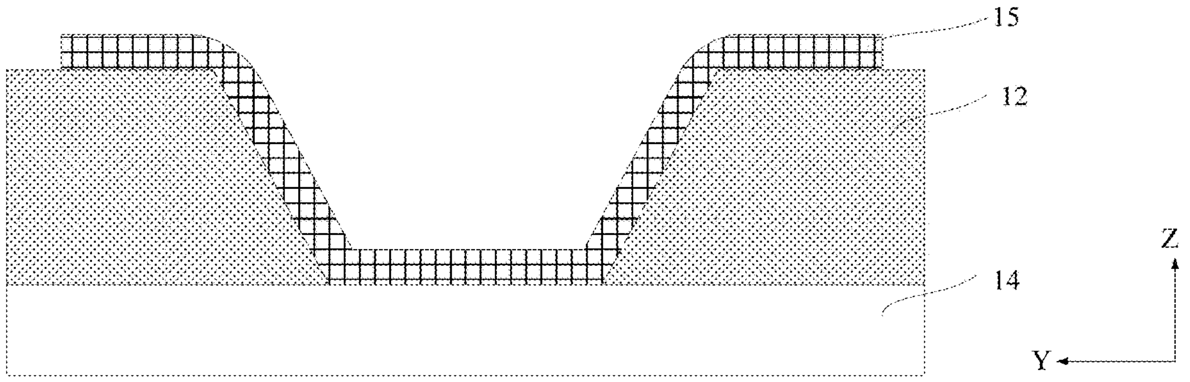

FIG. 8 is a schematic cross-sectional view in the direction BB of FIG. 7, wherein, as shown in FIG. 13, the portion of the first connection line 15 overlapping the side wall of the groove may be smooth.

Figure 9:
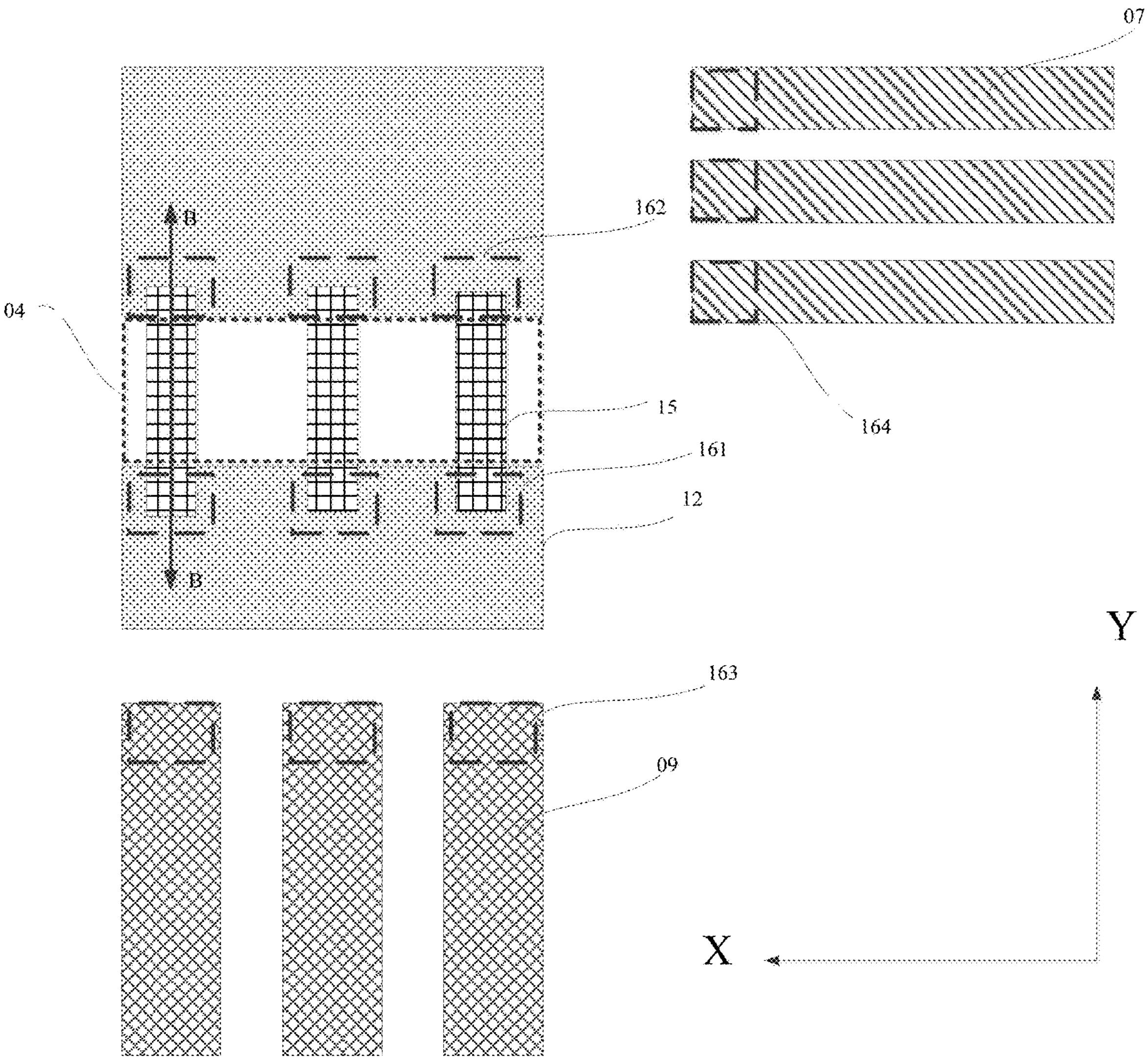
Figure 10:
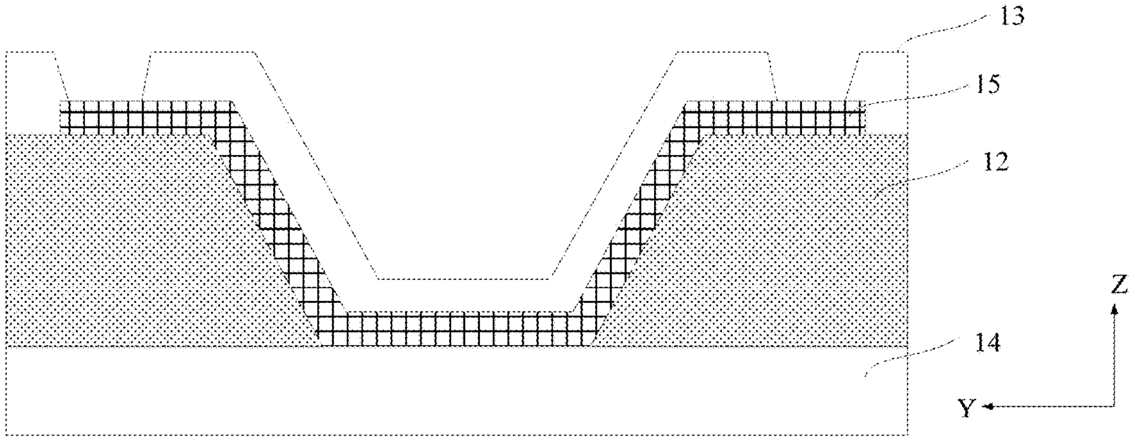

Step 3, as shown in FIGS. 9 and 10, forming a second insulating layer 13.

Specifically, magnetron sputtering, thermal evaporation, PECVD or other film-forming methods may be used to deposit a passivation layer with a thickness of 2000-1000 Å as the second insulating layer 13 on the display substrate after step 2 is completed. The passivation layer may be made of a material selected from oxides, nitrides or oxynitride compounds. Specifically, the material of the passivation layer may be SiNx, SiOx or Si(ON)x; and $Al_2O_3$ may also be used as the passivation layer. The passivation layer may be of single layer structure or two-layer structure composed of silicon nitride and silicon oxide. The reaction gas corresponding to the oxides of silicon may be $SiH_4$, and $N_2O$; the gas corresponding to nitrides or oxynitrides may be $SiH_4$, $NH_3$, $N_2$ or $SiH_2Cl_2$, and $NH_3$, $N_2$. The pattern of the passivation layer including the via hole is formed through one patterning process, and the via hole exposes the first connection line 15.

FIG. 10 is a schematic cross-sectional view in the BB direction of FIG. 9.

Step 4, as shown in FIGS. 11 and 12, forming a second connection line 17.

Specifically, a second transparent conductive layer with a thickness of 300 to 1500 Å may be deposited on the display substrate through sputtering or thermal evaporation after Step 3 is completed, wherein the second transparent conductive layer may be made of ITO, IZO or other transparent metal oxides. Then, a layer of photoresist is coated on the second transparent conductive layer, and a mask plate is used to expose the photoresist so that the photoresist forms a photoresist unreserved region and a photoresist reserved region, wherein the photoresist reserved region corresponds to a region where the pattern of the second connection line 17 is located, and the photoresist unreserved region corresponds to a region outside the above-mentioned pattern. Developing treatment is performed, and the photoresist in the photoresist unreserved region is completely removed, while the photoresist thickness in the photoresist reserved region remains unchanged. The transparent conductive layer film in the area where the photoresist does not reserved is completely etched away by an etching process, and the remained photoresist is stripped to form the second connection line 17, and the second connection line 17 is connected to the first connection line 15 via the via holes 161 and 162.

In this embodiment, the first connection line 15 and the second connection line 17 constitute the connection wiring connecting the signal line 09 and the clock signal line 07. As the first connection line 15 is a complete conductive pattern, which does not include a hollowed-out region, so that when forming the first connection line, the photoresist for forming the first connection line on the first transparent conductive layer may be exposed to form the first connection line without breaking the first connection line, so as to prevent the residual first transparent conductive layer in the groove, resulting in a short circuit of the signal lines.

In this embodiment, the peripheral region of the display substrate is provided with a plurality of clock signal lines 07 arranged in parallel and spaced apart from each other, the widths of adjacent clock signal lines 07 may be the same or different from each other, and the spacing between adjacent clock signal lines 07 may be the same or different.

The via holes (including the via holes 161, 162, 163 and 164) may be an elliptical via hole, a circular via hole or a rectangular via hole. When the via hole is an elliptical via hole, the cross section of the via hole in the direction parallel to the base substrate (the cross section on the XY plane) is elliptical. When the via hole is a circular via hole, the cross section of the via hole in the direction parallel to the base substrate (the cross section on the XY plane) is circular. When the via hole is a rectangular via hole, the cross section of the via hole in the direction parallel to the base substrate (the cross section on the XY plane) is rectangular. In some embodiments, the via hole may be a rectangular via hole, and the side length of the rectangle may be 6-8 um.

It should be noted that the various embodiments described herein are described in a progressive manner with reference to the same or similar parts throughout the various embodiments, with each embodiment focusing on differences from the other embodiments. In particular, the embodiments are described more simply because they are substantially similar to the product embodiments, with reference to the partial description of the product embodiments.

Unless defined otherwise, technical or scientific terms used in this disclosure shall have the ordinary meaning as understood by one of ordinary skill in the art to which this disclosure belongs. The terms "first", "second", and the like as use herein do not denote any order, quantity, or importance, but rather are used to distinguish one element from another. The terms "comprising" or "comprises", and the like, means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

While the present disclosure has been described with reference to specific embodiments thereof, it will be understood by those skilled in the art that various changes may be made and equivalents may be substituted for elements thereof without departing from the scope of the disclosure. Accordingly, the protection sought herein is as set forth in the claims below.

What is claimed is:

1. A display substrate, comprising a base substrate, the base substrate comprising a display region and a peripheral region surrounding the display region, wherein the display substrate comprises:

a first signal line and a second signal line arranged in the peripheral region of the base substrate; and a first insulating layer located on a side of the first signal line, wherein in a direction perpendicular to the base substrate, the side is away from the base substrate, wherein the first signal line and the second signal line are connected via a connection wiring, the connection wiring is located on a side of the first insulating layer away from the base substrate, a groove is formed on the side of the first insulating layer away from the base substrate, the depth of the groove is greater than a preset threshold, and an orthographic projection of the connection wiring on the base substrate overlaps with an orthographic projection of the groove on the base substrate, wherein the connection wiring comprises a first connection line comprising a first portion and a second portion, wherein the first portion covers the bottom and side walls of the groove, and the second portion covers an area of the first insulating layer outside the groove, wherein the display substrate further comprises a second insulating layer located on a side of the first connection line away from the base substrate, wherein the connection wiring further comprises a second connection line located on a side of the second insulating layer away from the base substrate, and wherein the second connection line is connected to the first connection line via a via hole penetrating the second insulating layer, the second connection line is provided for connecting the first connection line to the first signal line and the second signal line, an orthographic projection of the second connection line on the base substrate does not overlap with the orthographic projection of the groove on the base substrate, and the depth of the via hole is less than the depth of the groove.

2. The display substrate according to claim 1, wherein a first orthographic projection of the first portion on the base substrate is located within the orthographic projection of the groove on the base substrate, a second orthographic projection of the second portion on the base substrate is located outside the orthographic projection of the groove on the base substrate, and a ratio of area of the first orthographic projection to the second orthographic projection ranges from 6:1 to 1:1.

3. The display substrate according to claim 1, wherein an extending direction of the first connection line is parallel with an extending direction of the first signal line.

4. The display substrate according to claim 1, wherein a distance between adjacent first connection lines is 10-15 um.

5. The display substrate according to claim 1, wherein the second connection line comprises a hollowed-out region, and an extending direction of the hollowed-out region is parallel to an extending direction of the second connection line.

6. The display substrate according to claim 5, wherein the second connection line comprises a third portion and a fourth portion, a third orthographic projection of the third portion on the base substrate is located within the orthographic projection of the first connection line on the base substrate, a fourth orthographic projection of the fourth portion on the base substrate is located outside the orthographic projection of the first connection line on the base substrate, and the ratio of area of the third orthographic projection to the fourth orthographic projection ranges from 1:20 to 1:25.

7. The display substrate according to claim 5, wherein the second connection line comprises a fifth portion and a sixth portion, a fifth orthographic projection of the fifth portion on the base substrate is located within an orthographic projection of the via hole on the base substrate, a sixth orthographic projection of the sixth portion on the base substrate is located outside the orthographic projection of the via hole on the base substrate, and a ratio of area of the fifth orthographic projection to the sixth orthographic projection ranges from 1:20 to 1:25.

8. The display substrate according to claim 5, wherein the second connection line comprises a seventh portion and an eighth portion, the seventh portion connects the first connection line with the first signal line, the eighth portion connects the first connection line with the second signal line, the seventh portion extends in a direction parallel to the first signal line, the eighth portion is L-shaped, and the eighth portion comprises a first sub-portion parallel to the first signal line and a second sub-portion parallel to the second signal line.

9. The display substrate according to claim 1, wherein the via hole is a rectangular via hole with a side length of 6-8 um.

10. The display substrate according to claim 1, wherein the preset threshold is 2 um.

11. The display substrate according to claim 1, wherein the connection wiring is made of a transparent conductive material.

12. The display substrate according to claim 1, wherein the second connection line is located in the same layer and made of the same material as a pixel electrode of the display substrate; and/or, the first connection line is located in the same layer and made of the same material as a common electrode of the display substrate.

13. The display substrate according to claim 1, wherein the first signal line is a clock signal line of a gate driving unit;

the second signal line is a signal line of a sector region.

14. A display device, comprising the display substrate of claim 1.

15. A method for manufacturing a display substrate, the display substrate comprising a base substrate, the base substrate comprising a display region and a peripheral region surrounding the display region, the method comprising:

forming a first signal line and a second signal line arranged in the peripheral region of the base substrate;

forming a first insulating layer located on a side of the first signal line, wherein in a direction perpendicular to the base substrate, the side is away from the base substrate;

forming a connection wiring connecting the first signal line and the second signal line, wherein the connection wiring is located on a side of the first insulating layer away from the base substrate, a groove is formed on the side of the first insulating layer away from the base substrate, the depth of the groove is greater than a preset threshold, and an orthographic projection of the connection wiring on the base substrate overlaps with an orthographic projection of the groove on the base substrate, wherein the forming the connection wiring comprises forming a first conductive layer on the side of the first insulating layer away from the base substrate, forming a photoresist pattern on the first conductive layer, overexposing the photoresist pattern, and etching the first conductive layer using the photoresist pattern as a mask to form a first connection line, wherein the first connection line comprises a first portion and a second portion, wherein the first portion covers the bottom and side walls of the groove, and the second portion covers an area of the first insulating layer outside the groove; and forming a second insulating layer located on a side of the first connection line away from the base substrate, patterning the second insulating layer to form a via hole exposing the first connection line, wherein the depth of the via hole is less than the depth of the groove, wherein the forming the connection wiring further comprises forming a second connection line located on a side of the second insulating layer away from the base substrate, wherein the second connection line is connected to the first connection line via a via hole penetrating the second insulating layer, the second connection line is provided for connecting the first connection line to the first signal line and the second signal line, an orthographic projection of the second connection line on the base substrate does not overlap with the orthographic projection of the groove on the base substrate, and the depth of the via hole is less than the depth of the groove.

* * * * *